United States Patent [19]

McClure

[11] Patent Number: 5,502,678

[45] Date of Patent: Mar. 26, 1996

[54] FULL MEMORY CHIP LONG WRITE TEST MODE

[75] Inventor: David C. McClure, Carrollton, Tex.

[73] Assignee: SGS-Thomson Microelectronics, Inc., Carrollton, Tex.

[21] Appl. No.: 315,337

[22] Filed: Sep. 30, 1994

[51] Int. Cl.⁶ ..................................................... G11C 29/00
[52] U.S. Cl. ................... 365/201; 365/154; 365/230.03; 365/156; 371/21.1
[58] Field of Search ..................................... 365/201, 154, 365/156, 230.03, 233; 324/210; 371/21.4, 21.1, 21.3, 15.1

[56] References Cited

U.S. PATENT DOCUMENTS 5,255,230  10/1993  Chan et al. ............................ 365/201

OTHER PUBLICATIONS

Test of Random–Access Memory, IBM Technical Disclosure Bulletin, vol. 29 No. 8 Jan. 1987, pp. 3622–3625.

*Primary Examiner*—David C. Nelms
*Assistant Examiner*—Huan Hoang
*Attorney, Agent, or Firm*—Renee M. Larson; Lisa K. Jorgenson; Richard K. Robinson

[57] ABSTRACT

According to the present invention, a first memory block of the memory chip is placed into the long write test mode, meaning that all wordlines of the first memory block are turned off and the voltages on all the bitlines of the first memory block are controlled such that either all the bitlines true of a memory block are equal to a low logic level, all the bitlines complement of the memory block are equal to the low logic level, or all the bitlines true and bitlines complement of the memory block are both equal to the low logic level. Next, a second memory block of the memory chip is likewise placed into the long write test mode, while the first memory block remains in the long write test mode. After a long pause which causes a long write disturb condition, the memory blocks of the memory chip are one by one taken out of the long write test and read disturbed. Then, the rows of the first memory block are selected, one by one, in minimal cycle time to read disturb the first memory block. Next, the second memory block of the memory chip is likewise placed into the read disturb mode, while the first memory block is deselected and thus not affected.

48 Claims, 2 Drawing Sheets

5,502,678

FULL MEMORY CHIP LONG WRITE TEST MODE

CROSS REFERENCE TO RELATED APPLICATIONS

The subject matter of the present application is related to U.S. patent application Ser. No. 08/173,197, titled "Improved Static Memory Long Write Test", Docket No.: 93-C-82, filed Dec. 22, 1993, and U.S. patent application Ser. No. 08/267,667, titled "Long Write Test", Docket No.: 94-C-28, filed Jun. 29, 1994, both of which are assigned to the assignee hereof and herein incorporated by reference.

BACKGROUND OF THE INVENTION

The present invention relates generally to memory testing, and more specifically to long write testing of memory chips.

Writing to a memory cell or cells of memories, such as Static Random Access Memories (SRAMs), multiple port memories, and First In First Out (FIFO) memories, can sometimes adversely affect adjacent memory cells on the same column that share a bitline. These adjacent memory cells should not be affected if their wordlines are off; however, leakage from a memory cell node to a bitline may be sufficient to overcome the pull-up resistance of an adjacent non-selected memory cell, causing the data of that memory cell to become corrupted. This problem is exacerbated when memory cells are subjected to a long write cycle, because there is greater opportunity for such leakage to occur by virtue of the length of the write cycle. Therefore, memory cell node to bitline leakage and subsequent corruption of adjacent non-selected memory cells is often a concern during long write testing of a memory device.

Long write testing is typically conducted after writing a test data pattern to selected memory cells of a memory device. The leakage problem associated with a long write test occurs when writing to memory cells along a column and inadvertently affecting non-selected memory cells, whose wordlines are off. The non-selected memory cells that are affected experience leakage from the memory cell node to a bitline which causes them to erroneously change state. The write cycle during a long write test is typically quite long, thereby increasing the probability that the leakage problem will occur.

Unfortunately, the test modes which may be used to screen for bitline to cell leakage may introduce additional problems. Such test modes may themselves adversely affect the long write test by introducing large switching transients. For instance, after the wordlines of all memory cells of a memory device are turned off, a test mode may simultaneously pull down either bitline true or bitline complement in order to "disturb" the memory cells. The memory cells may then be read following the disturb condition to check for errors in the states of individual memory cells. However, the act of simultaneously pulling large numbers of bitlines to a given logic state necessarily introduces large current switching transients. Additionally, memory cell recovery time of disturbed memory cells following such stress testing may be of an undesirably long duration.

Thus, there exists an unmet need in the art to be able to perform a long write test of a memory device in a manner that effectively identifies leakage problems while also minimizing long write test time, current switching transients, and memory cell recovery time.

SUMMARY OF THE INVENTION

It would be advantageous in the art to effectively and efficiently perform a long write test of a memory chip, thereby reducing the long write test time.

It would further be advantageous in the art to perform a long write test of a memory chip which effectively identifies memory cell bitline to cell leakage problems.

It would further be advantageous in the art to perform a long write test of a memory chip which minimizes current switching transients, thereby allowing for a more realistic long write test.

It would further be advantageous in the art to minimize disturbed memory cell recovery time following a long write test of a memory chip.

Therefore, according to the present invention, a memory chip to be subjected to a long write test is divided into a plurality of memory blocks. A first memory block of the memory chip is placed into the long write test mode, meaning that all wordlines of the first memory block are turned off and the voltages on all the bitlines of the first memory block are controlled such that either all the bitlines true of a memory block are equal to a low logic level, all the bitlines complement of the memory block are equal to the low logic level, or all the bitlines true and bitlines complement of the memory block are both equal to the low logic level. As an option, all the columns of the first memory block may be turned on in order to thus control the voltages of the bitlines of the memory block. Next, a second memory block of the memory chip is likewise placed into the long write test mode, while the first memory block remains in the long write test mode. This process, which may be likened to falling "dominos", continues until all of the plurality of memory blocks are thus placed in the long write test mode. After a long pause which causes a long write disturb condition, the memory blocks of the memory chip are one by one taken out of the long write test and read disturbed. Thus, the first memory block is reselected, taking it out of the long write test mode, and placed in a read disturb mode, meaning that the wordlines of the first memory block can be enabled and the bitlines of the first memory block are not forced to a low logic level. Then, the rows of the first memory block are selected, one by one, in minimal cycle time to read disturb the first memory block. During the read disturb of the first memory block, all other memory blocks remain in the long write test mode. Next, the second memory block of the memory chip is likewise placed into the read disturb mode, while the first memory block is deselected and thus not affected. This process, which also resembles falling "dominos", continues until all of the plurality of memory blocks are thus read disturbed and then deselected to the normal operating mode.

BRIEF DESCRIPTION OF THE DRAWINGS

The novel features believed characteristic of the invention are set forth in the appended claims. The invention itself, however, as well as preferred modes of use, and further objects and advantages thereof, will best be understood by reference to the following detailed description of illustrative embodiments when read in conjunction with the accompanying drawings, wherein:

DESCRIPTION OF THE INVENTION

The present invention describes an effective and efficient manner of testing a memory chip that effectively identifies leakage problems while also minimizing long write test time, current switching transients, and memory cell recovery time.

Figure 1:
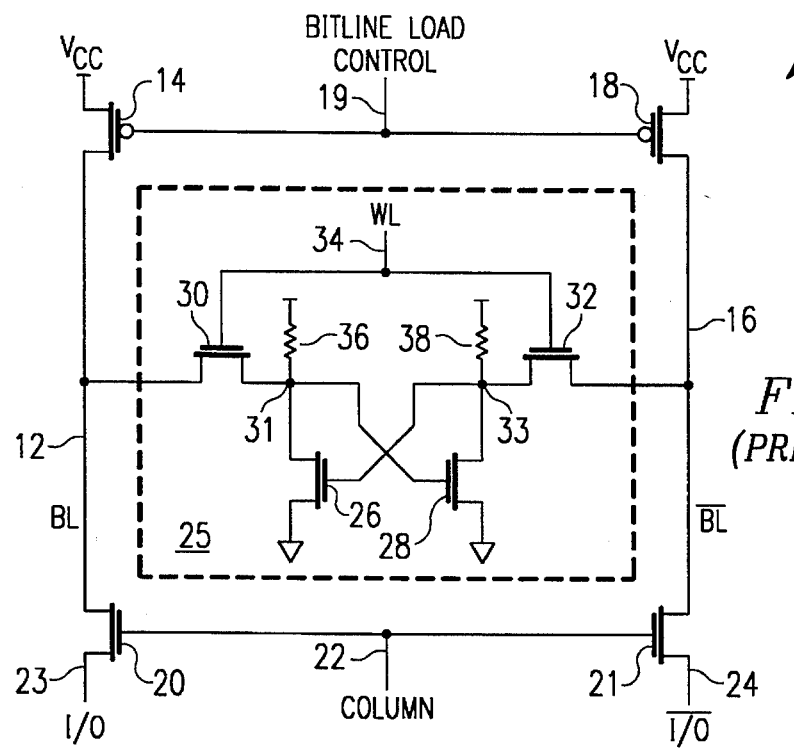
FIG. 1 is a memory structure, having a memory cell, of the type commonly used in the art.

Referring to FIG. 1, a memory structure of a memory chip, having a memory cell 25, which is representative of the type commonly used in the art and may be used in conjunction with the present invention, is shown. Bitline true 12 has a bitline true load 14, and bitline compliment 16 has bitline complement load 18, connected as shown in FIG. 1. The gates of bitline true load 14 and bitline complement load 18 are controlled by Bitline Load Control signal 19. The bitline true load 14 and bitline complement load 18 are the gates of p-channel transistors; one skilled in the art will recognize that the gates of n-channel transistors could serve as load devices as well. The gate of n-channel transistors 20 and 21 are controlled by Column signal 22; A source/drain of transistor 20 is electrically connected to Input/Output signal I/O 23 while a source/drain of transistor 21 is electrically connected to Input/Output bar signal I/O 24 as shown.

Memory cell 25 of memory structure 10 is of the Poly R Load type well known in the art and resides between bitline true 12 and bitline complement 16. The Poly R Load memory cell 25 has n-channel transistor 30 whose source/drain is connected to bitline true 12, and n-channel transistor 32 whose source/drain is connected to bitline complement 16. The gates of nochannel transistors 30 and 32 are connected to and controlled by wordline signal 34. The source/drain connections of n-channel transistors 26 and 28 are connected to n-channel transistors 30 and 32, respectively, as shown and are pulled up to the memory cell supply voltage Vcc through polycrystalline silicon resistors 36 and 38, respectively. Memory cell node 31 is defined as the electrical connection of n-channel transistors 26, 28, 30, and polycrystalline silicon resistor 36. Memory cell node 33 is defined as the electrical connection of n-channel transistors 26, 38, 32, and polycrystalline silicon resistor 38. While a Poly-R Load memory cell is shown, other types of memory cells, such as a 6 Transistor memory cell, may also be used in conjunction with the present invention.

According to the present invention, a full chip long write test methodology tests memory cell to bitline leakage of a full memory chip while minimizing long write test time, transients currents, and memory cell recovery time following the write disturb of the long write test. These goals are accomplished by performing the long write on the entire memory chip, with a "domino" style entry into and exit from the long write test, as will be described below.

Figure 2:
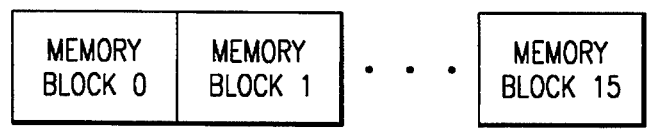
FIG. 2 is a block diagram of the memory blocks of a memory chip, according to the present invention.

The memory chip to be tested is divided into a plurality of memory blocks. Referring to FIG. 2, the memory chip to be tested is composed of 16 memory blocks, for example, Memory Block0, Memory Block1, . . . Memory Block15. Each memory block contains any number of memory structures having memory cells analogous to memory structure 10 and memory cell 25 of FIG. 1. Dividing the memory chip into 16 memory blocks is shown as an example only; any number of memory blocks or other divisions of the memory chip may be utilized.

According to the present invention, the first memory block, Memory Block0, is selected and put into a long write test mode. In the long write test mode, all the wordlines of Memory Block0, represented by wordline signal 34, are turned off, and the voltages on the bitlines true 12 and bitlines complement 16 are controlled such that one of three conditions occurs: all the bitlines true 12 of Memory Block0 are a low logic level, all the bitlines complement 16 of Memory Block0 are a low logic level, or both the bitlines true 12 and bitlines complement 16 of Memory Block0 are a low logic level. As is recognized in the art, bitline loads 14 and 18 may be turned off and the Columns of Memory Block0, through Column signal 22, may be turned on in order to control the voltages on bitlines true 12 and bitlines complement 16 as described above. One skilled in the art, however, will recognize that means other than turning on the Columns may be used to control the voltage on bitlines true 12 and bitlines complement 16 of Memory Block0.

Next, Memory Block1 is selected and put into the long write test mode as described above with respect to Memory Block0, while Memory Block0 remains in the long write test mode. Thus, all the wordline signals 34 of Memory Block1 are turned off, all the columns of Memory Block1 may be turned on, as an option, and the bitlines of Memory Block1 are written to in the appropriate manner, as described above. Next, Memory Block2 is selected and put into the long write test mode, while Memory Block0 and Memory Block1 remain in the long write test mode. This "domino" style sequence continues until all sixteen memory blocks are selected and placed into the long write test mode, one after the other like falling dominoes.

After a long pause, on the order of microseconds, which causes a long write disturb, the memory blocks are one by one taken out of the long write test mode and read disturbed in the following manner. First, Memory Block0 is reselected, taking it out of the long write test mode, and placed in a read disturb mode, meaning that the wordlines 34 of Memory Block0 may be enabled and the bitlines true 12 and bitlines 16 complement of Memory Block0 are not written. Then, the rows of Memory Block0 are selected, one by one, in minimal cycle time to read disturb the first memory block. During this time, all other fifteen memory blocks are still in the long write test mode. Next, Memory Block1 is reselected and read disturbed as described above with respect to Memory Block0; Memory Block0 is now deselected and thus is not affected. At this time, the other fifteen memory blocks remain in the long write test mode. Next, Memory Block1 is reselected, taking it out of the long write mode, and placed in the read disturb mode as described above. Thus, the wordlines 34 of Memory Block1 may be enabled and the bitlines true 12 and bitlines complement 16 are not written. The rows of Memory Block1 are enabled row fast, minimum cycle, so that all memory cells 25 of Memory Block1 are disturbed. While Memory Block1 is thus being read disturbed, Memory Block0 is deselected and thus is not affected. This pattern continues until all sixteen memory blocks have been chronologically read disturbed, and the pattern again resembles that of falling dominos. When all sixteen memory blocks have been read disturbed, all the memory blocks will be in the normal operating mode.

Thus, according to the present invention, entry into the long write test mode and exit from the long write test mode into the read disturb mode, as well as entry into a normal operating mode, is performed in a chronological or serial fashion. Performing these functions in a serial manner keeps transient current and the time required for a memory cell 25 to recover before it can be hit with a read disturb condition to a minimum, i.e. the amount of time required to perform these functions on just one memory block.

The actual time required to perform the time-consuming long write test is reduced by performing the long write test in a parallel fashion across the entire die of the memory chip, thereby minimizing the long write test time. The long write testing may be set-up such that all memory blocks are equally disturbed. Additionally, the read disturb time can be buried into the long write testing of remaining memory blocks further reducing the required test time. Thus; for the sixteen memory block example outlined above, the total long write test time may be reduced to the amount of time required to shift all sixteen memory blocks into the long write test mode, plus the time required for the long write disturb pause, and plus the time required to establish the read disturb for just one memory block. Shifting the memory blocks into the long write test mode can be done approximately every 30 nS, a minimal amount of time, so that the long write test time is effectively reduced to the time required for the single long write disturb pause time, as opposed to (512 to 1024 columns of the chip) * (Pause time)* 512+16*(Read Disturb time), assuming there are 256 cells per bitline and two passes over the chip.

The circuitry required to support the long write test methodology described above may take many forms. A state machine can be used, for example. Prior to entry into the long write test mode, the global column signals of the memory blocks are jammed or placed in an enabling state; additionally, the bitlines may be individually controlled through other means as well. The state machine can be programmed such that State 1 of the state machine represents the long write test mode (LWTM) and State 2 of the state machine represents the read disturb test mode (RDTM). A memory block of the memory chip would enter into State 1 when it is initially enabled (while in the test mode). Each memory block stays in LWTM until reselected again. Upon reselection, a memory block enters the RDTM. In transitioning from State 1 to State 2, a row address may be jammed off in a deselecting state (which leaves no wordlines enabled) to allow bitline recovery before the wordline is selected for read disturb. Table 1 below summarizes this circuit activity, outlining the state of the Block Rows, Block Columns, Block Write signals, and Block ETD (Edge Transition Detection) signals during State 1 and State 2.

TABLE 1

| State | / | Block Rows | Block Columns | Block Write | Block ETD |
|---|---|---|---|---|---|
| 1 | / | All OFF | All ON | ON | OFF |
| 0 | / | One can be ON | OFF, or one ON | OFF | Can be ON |

Figure 3:
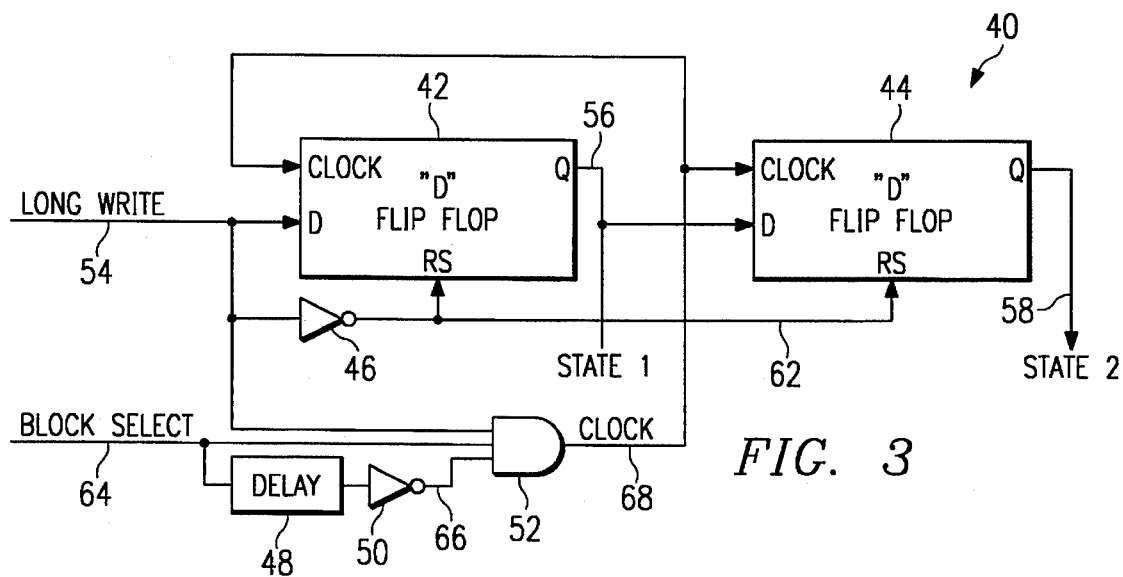
FIG. 3 is a schematic diagram of state machine circuitry, according to the present invention.

According to the state machine example, each memory block is associated with the equivalent of the state machine circuitry 40 shown in FIG. 3. State machine circuitry 40 is comprised of D Flip Flop 42, D Flip Flop 44, inverters 46, 50, delay block 48, and AND logic gate 52. Long Write signal 54 drives D Flip Flop 42 and is an input signal to AND gate 52. Signal 62, the inverse of Long Write signal 54, is the reset input signal to both D Flip Flop 42 and D Flip Flop 44, as shown. The output signal of D Flip Flop 42 is State 1 signal 56 which is used to drive D Flip Flop 44. The output signal of D Flip Flop 44 is State 2 signal 58. Block Select signal 64 and Long Write signal 54 are both input signals to AND gate 52; the other input signal to AND gate 52, signal 66, is produced by passing Block Select signal 64 through a delay element 48 and then through inverter 50. AND gate 52 generates Clock signal 68, a high true signal, which is presented to the clock inputs of both D Flip Flop 42 and D Flip Flop 44, as shown. Long Write signal 54 allows Clock signal 68 to be produced only when in a long write test mode; Long Write signal 54 is an optional input signal to AND gate 52. Delay element 48 and inverter 50 have the effect of allowing AND gate 52 to generate a pulse Clock signal 68; when Block Select signal 64 transitions to a logic high (1), Clock signal 68 is a logic high until Block Select signal 64 passes through delay element 48 and inverter 50 and is presented to AND gate 52 as signal 66. The pulse duration of Clock signal 68 is determined by the amount of delay introduced by delay element 48 and inverter 50. Table 2 summarizes the operation of state machine circuitry 40 as a function of State 1 and State 2.

TABLE 2

| State 1 | State 2 | / | Mode |
|---|---|---|---|
| 0 | 0 (initially) | / | Normal, Pre-Long Write |
| 1 | 0 (1st time Block selected) | / | Long Write (LWTM) |
| 1 | 1 (2nd time Block selected) | / | Read Disturb (RDTM) |

Following is a description of the operation of state machine circuitry 40. Initially, before the test mode is entered, Long Write signal 54 is a logic low (0), and State 1 signal 56 and State 2 signal 58 are each a logic low "0". Long Write signal 54 transitions to a logic high (1) when in the long write test mode. Clock signal 68 pulses high, then goes low, each time a memory block is selected. Thus, the first time a memory block is selected a "1" is clocked for State 1 signal 56. The second time the memory block is selected, State 1 signal 56 and State 2 signal 58 are both a logic "1" and the memory block is in a read disturb mode.

Figure 4A:
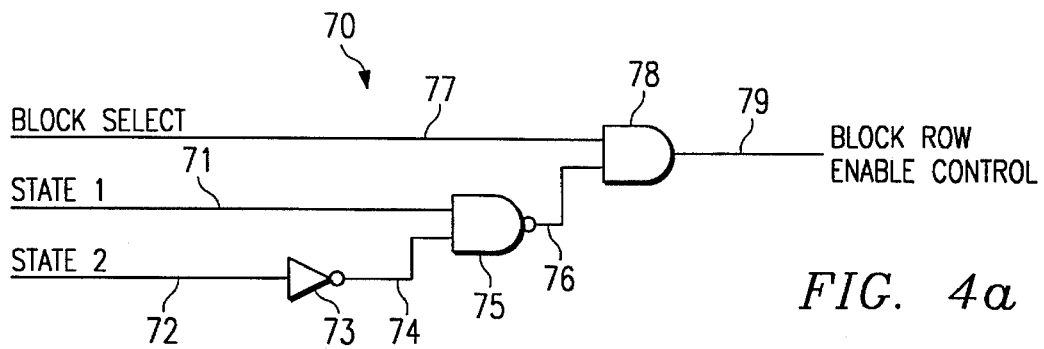
FIGS. 4a, 4b, 4c, and 4d are alternate embodiments showing how the Block Select, State 1, and State 2 signals of FIG. 3 may be utilized, according to the present invention.

FIGS. 4a, 4b, 4c, and 4d provide alternate embodiments showing how the Block Select, State 1, and State 2 signals of FIG. 3 may be utilized, and FIGS. 4a, 4b, 4c, and 4d are associated with each memory block of the full memory chip. Referring to FIG. 4a, Block Row Enable circuitry 70 is comprised of various input and output signals and the following logic elements: inverter 73, NAND gate 75, and AND gate 78. State 1 signal 71 is a first input signal to NAND gate 75. A second input signal 74 to NAND gate 75 is generated by passing State 2 signal 72 through inverter 73. NAND gate 75 generates signal 76 as a function of State 1 signal 71 and signal 74. Signal 76 and Block select signal 77 are input signals to AND gate 78, which generates Block Row Enable Control signal 79; the value of Block Row Enable Control Enable signal 79 is a function of the values of Block Select signal 77 and signal 76 provided to AND gate 78. Block Row Enable Control signal 79 is forced to a low logic level "0" in the LVVTM and is forced to a high logic level "1" when the block is selected and in the RDTM. A logic high level on Block Row Enable Control signal 79 allows rows within the block to be enabled.

Figure 4B:
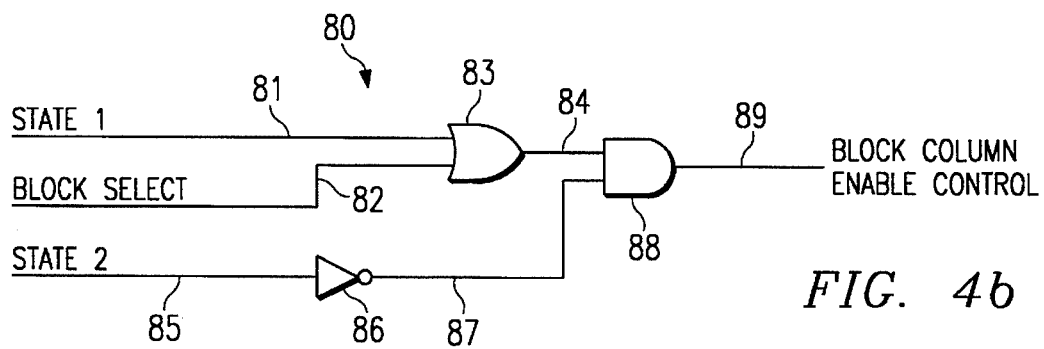

Referring to FIG. 4b, Block Column Enable circuitry 80 is shown. Block Column Enable circuitry 80 is comprised of various signals and the following logic elements: OR gate 83, inverter 86, and AND gate 88. State 1 signal 81 and Block Select signal 82 are input signals to OR gate 83 which generates signal 84. State 2 signal 85 is presented to inverter 86 which produces signal 87. Signals 84 and 87 are input signals to AND gate 88 which generates Block Column Enable Control signal 89 whose logic level is determined by the logic levels of signals 84 and 87. Block Column Enable Control signal 89 is forced to a high logic state "1" in the LWTM and to a low logic state "0" in the RDTM. A logic high level on Block Column Enable Control signal 89 allows column enabling within the block.

Figure 4C:
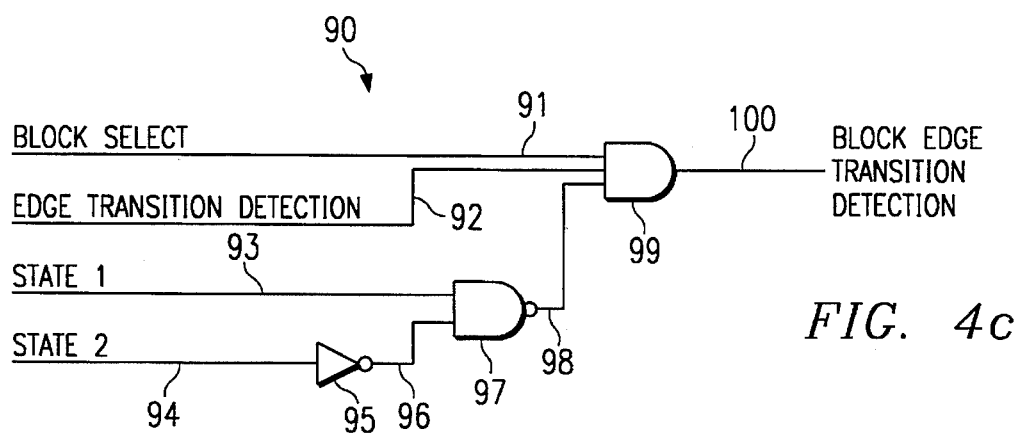

Referring now to FIG. 4c, Block ETD (Edge Transition Detection) circuitry 90, comprised of inverter 95, NAND gate 97, AND gate 99, and various signals is shown. Block Select signal 91 is a first input signal, ETD (Edge Transition Detection) signal 92 is a second input signal, and signal 98 is a third input signal to AND gate 99. Signal 98 is the output signal of NAND gate 97. State 1 signal 93 is a first input signal to NAND gate 97. Signal 96 is a second input signal to NAND gate 97 and is generated by passing State 2 signal 94 through inverter 95;-thus signal 96 is the inverse of State 2 signal 94. AND gate 99 generates Block ETD (Edge Transition Detection) signal 100, the value of which is determined by the logic states of Block Select signal 91, ETD signal 92, and signal 98. Block ETD signal 100 is forced to a low logic level in the LWTM, but is not forced to any particular level in the RDTM. When Block ETD signal 100 is a high logic level, enabling of ETD signal 92 is allowed in that given block and Block ETD signal 100 is capable of detecting the edge transition of an input signal to the full memory chip.

Figure 4D:
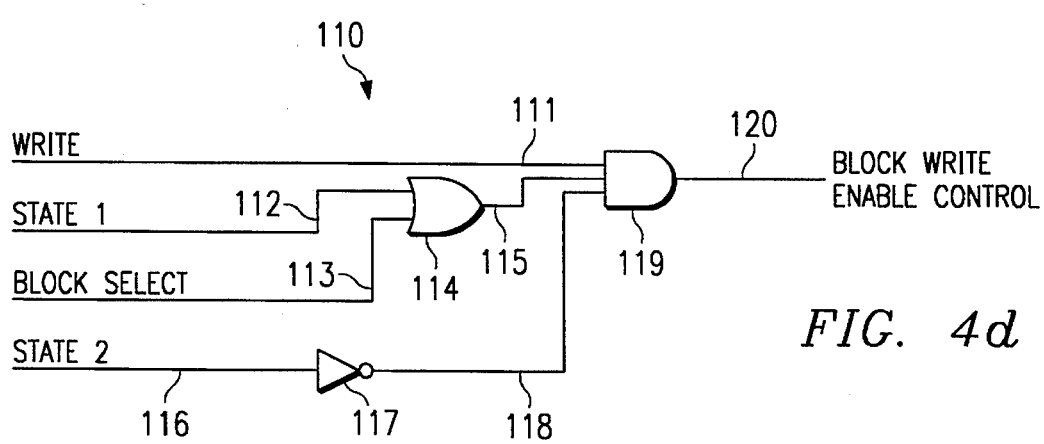

Referring to FIG. 4d, Block Write Enable circuitry 110 is shown. Block Write Enable circuitry 110 is comprised of OR gate 114, inverter 117, AND gate 119 and assorted input and output signals which will now be discussed. State 1 signal 112 is a first input signal to OR gate 114, while Block Select signal 113 is a second input signal to OR gate 114, which produces signal 115 as an input signal to AND gate 119. State 2 signal 116 is presented to inverter 117, which generates signal 118. Write signal 111 as well as signals 115, and 118, are input signals to AND gate 119 which generates Block Write Enable Control signal 120. The value of Block Write Enable Control signal 120 is determined by the state of Write signal 111, signal 115, and signal 118. When Write signal 111 is a high logic level, Block Write Enable Control signal 120 is forced to a high logic level in the LWTM and is forced to a low logic level in the RDTM. When Block Write Enable Control signal 120 is a high logic level, writing is allowed within that given block.

Performing a long write test according to the present invention allows maximum fault coverage of a memory chip with a minimal test time penalty. This provides the advantage of being able to readily identify faulty and/or marginal cells of the memory chip. Thee full chip long write test methodology of the present invention tests memory cell to bitline leakage of a full memory chip while minimizing long write test time, transients currents, and memory cell recovery time following the write disturb of the long write test. These goals are accomplished by performing the long write on the entire memory chip, with a "domino" style entry into and exit from the long write test.

While the invention has been particularly shown and described with reference to a preferred embodiment, it will be understood by those skilled in the art that various changes in form and detail may be made therein without departing from the spirit and scope of the invention. For instance, the logic gates and electrical connections of logic gates shown in FIGS. 4, and 4a to 4b may easily be replaced with other logic gates and only minor modification to the circuitry, as is well known in the art.

What is claimed is:

1. A method of performing long write testing of a full memory chip, comprising the steps of:

dividing a memory chip into a plurality of memory blocks, wherein each memory block of the plurality of memory blocks contains a plurality of memory cells, a plurality of rows, a plurality of columns, a plurality of wordlines, a plurality of bitlines true, and a plurality of bitlines complement;

placing a first memory block of the plurality of memory blocks into a long write test mode upon selecting the first memory block, and turning off the plurality of wordlines of the first memory block and forcing at least the bitlines true or the bitlines complement of the first memory block to a low logic level, wherein the first memory block remains in the long write test mode until selected again; and placing a second memory block of the plurality of memory blocks into the long write test mode Upon selecting the second memory block, and turning off the plurality of wordlines of the second memory block and forcing at least the bitlines true or the bitlines complement of the second memory block to the low logic level, wherein the second memory block remains in the long write test mode until selected again, wherein placing the first memory block into the long write test mode followed by placing the second memory block into the long write test mode constitutes a "domino" style entry into the long write test mode.

2. The method of claim 1, wherein in placing the first memory block into the long write test mode, also turning on the plurality of columns within the first memory block and in placing the second memory block into the long write test mode, also turning on the plurality of columns of the second memory block.

3. The method of claim 1, wherein, in placing the first memory block and the second memory block into the long write test mode, the bitlines true of the first memory block and the bitlines true of the second memory block are forced to the low logic level.

4. The method of claim 1, wherein, in placing the first memory block and the second memory block into the long write test mode, the bitlines true and the bitlines complement of the first memory block and the bitlines true and the bitlines complement of the second memory block are forced to the low logic level.

5. The method of claim 1, wherein all of the plurality of memory blocks of the memory chip are placed into the long write test mode.

6. The method of claim 1, wherein the memory chip is a Static Random Access Memory (SRAM).

7. The method of claim 1, wherein each memory block of the plurality of memory blocks remains in the long write test mode until selected again.

8. The method of claim 1, wherein a plurality of bitline load elements are connected to the plurality of bitlines true and bitlines complement of the first memory block and the bitline load elements of the first memory block are turned off when the first memory block is placed in the long write test mode, and wherein a plurality of bitline load elements are connected to the plurality of bitlines true and bitlines complement of the second memory block and the bitline load elements of the second memory block are turned off when the second memory block is placed in the long write test mode.

9. The method of claim 1, wherein after the step of placing the first memory block and the second memory block of the plurality of memory blocks into the long write test mode, comprising the further steps of:

exiting the first memory block of the plurality of memory blocks from the long write test mode by reselecting the first memory block;

placing the first memory block of the plurality of memory blocks into a read disturb test mode upon selecting the first memory block, and allowing the wordlines of the first memory block to be enabled and not forcing the bitlines true or the bitlines complement of the first memory block to the low logic level, wherein the first memory block of the plurality of memory blocks remains in the read disturb test mode while selected;

exiting the second memory block of the plurality of memory blocks from the long write test mode by reselecting the second memory block; and placing the second memory block of the plurality of memory blocks into the read disturb test mode upon selecting the second memory block, and allowing the wordlines of the second memory block to be enabled and not forcing the bitlines true or the bitlines complement of the second memory block to the low logic level, wherein the second memory block of the plurality of memory blocks remains in the read disturb test mode while selected, wherein placing the first memory block into the read disturb test mode followed by placing the second memory block into the read disturb test mode constitutes a "domino" style entry into the read disturb test mode.

10. The method of claim 9, wherein after the steps of placing the first memory block and the second memory block of the plurality of memory blocks into the long write test mode and before the step of placing the first memory block of the plurality of memory blocks into the read disturb mode, comprising the additional step of:

performing a pause to cause a long write disturb of the memory chip.

11. The method of claim 9, wherein all of the plurality of memory blocks of the memory chip are placed into the read disturb test mode.

12. The method of claim 9, wherein the long write test mode is represented by a first state and the read disturb test mode is represented by a second state.

13. The method of claim 12, wherein the first state and the second state are generated by a state machine circuit, which is associated with each memory block of the memory chip, comprising:

a logic element, which has a block select signal as a first input signal and a delay signal as a second input signal and which produces a pulsed clock signal upon selection of the memory block;

a delay element, which has the block select signal as an input signal and which produces the delay signal as an output signal;

a first clocked Flip Flop which receives a long write signal as a first input signal, the pulsed clocked signal as a second input signal used for clocking the first clocked Flip Flop, and produces a first output signal; and a second clocked Flip Flop which receives the first output signal of the first clocked Flip Flop as a first input signal, the pulsed clocked signal as a second input signal for clocking the second clocked Flip Flop, and produces a second output signal.

14. The method of claim 13, wherein the first output signal, the second output signal, and the block select signal are utilized by block row enable circuitry to generate an output, signal capable of enabling the rows of a memory block of the plurality of memory blocks.

15. The method of claim 13, wherein the first output signal, the second output signal, and the block select signal are utilized by block column enable circuitry to generate an output signal capable of enabling the columns of a memory block of the plurality of memory blocks.

16. The method of claim 13, wherein the first output signal, the second output signal, the block select signal, and an edge transition detection signal are utilized by block edge transition detection circuitry to generate an output signal capable of detecting the edge transition of an input signal to the memory chip and communicating this detection to the memory block.

17. The method of claim 13, wherein the first output signal, the second output signal, the block select signal, and a write signal are utilized by block write enable circuitry to generate an output signal capable of enabling write control of a memory block of the plurality of memory blocks.

18. A method of performing long write testing of a full memory chip, comprising the steps of:

dividing a memory chip into a first memory block, having a plurality of memory cells, a plurality of rows, a plurality of columns, a plurality of wordlines, a plurality of true bitlines, and a plurality of complement bitlines; and a second memory block, having a plurality of memory cells, a plurality of rows, a plurality of columns, a plurality of wordlines, a plurality of bitlines true, and a plurality of bitlines complement;

placing the first memory block into a long write test mode upon selecting the first memory block, and turning off the plurality of wordlines of the first memory block and forcing at least the bitlines true or bitlines complement of the first memory block to a low logic level, wherein the first memory block remains in the long write test mode until selected again; and placing the second memory block into the long write test mode upon selecting the second memory block, and turning off the plurality of wordlines of the second memory block and forcing at least the bitlines true or bitlines complement of the second memory block to the low logic level, wherein the second memory block remains in the long write test mode until selected again.

19. The method of claim 18, wherein in placing the first memory block into the long write test mode, also turning on the plurality of columns of the first memory block and in placing the second memory block into the long write test mode, also turning on the plurality of columns of the second memory block.

20. The method of claim 18, wherein, in placing the first memory block and the second memory block into the long write test mode, the bitlines true of the first memory block and the bitlines true of the second memory block are forced to the low logic level.

21. The method of claim 18, wherein, in placing the first memory block and the second memory block into the long write test mode, the bitlines true and the bitlines complement of the first memory block and the bitlines true and the bitlines complement of the second memory block are forced to the low logic level.

22. The method of claim 18, wherein the memory chip is a Static Random Access Memory (SRAM).

23. The method of claim 18, wherein the memory chip is a multiple port memory.

24. The method of claim 18, wherein a plurality of bitline load elements are connected to the plurality of bitlines true and bitlines complement of the first memory block and a plurality of bitline load elements are connected to the plurality of bitlines true and bitlines complement of the second memory block, and the bitline load elements of the first memory block and the second memory block are turned off in the long write test mode.

25. The method of claim 18, wherein after the step of placing the second memory block into the long write test mode, comprising the further steps of:

exiting the first memory block of the plurality of memory blocks from the long write test mode by reselecting the first memory block;

placing the first memory block into a read disturb test mode upon selecting the first memory block, and allowing the wordlines of the first memory block to be enabled and not forcing the bitlines true or the bitlines complement of the first memory block to the low logic level, wherein the first memory block remains in the read disturb test mode while selected;

exiting the second memory block of the plurality of memory blocks from the long write test mode by reselecting the second memory block; and placing the second memory block into the read disturb test mode upon selecting the second memory block, and allowing the wordlines of the second memory block to be enabled and not forcing the bitlines true or the bitlines complement of the second memory block to the low logic level, wherein the second memory block remains in the read disturb test mode while selected.

26. The method of claim 25, wherein after the steps of placing the first memory block and the second memory block of the plurality of memory blocks into the long write test mode and before the step of placing the first memory block of the plurality of memory blocks into the read disturb mode, comprising the additional step of:

performing a pause to cause a long write disturb of the memory chip.

27. The method of claim 25, wherein the long write test mode is represented by a first state and the read disturb test mode is represented by a second state.

28. The method of claim 27, wherein the first state and the second state are generated by a state machine circuit, which is associated with each memory block of the memory chip, comprising:

a logic element, which has a block select signal as a first input signal and a delay signal as a second input signal and which produces a pulsed clock signal upon selection of a memory block;

a delay element, which has the block select signal as an input signal and which produces the delay signal as an output signal;

a first clocked Flip Flop which receives a long write signal as a first input signal, the pulsed clocked signal as a second input signal used for clocking the first clocked Flip Flop, and produces a first output signal; and a second clocked Flip Flop which receives the first output signal of the first clocked Flip Flop as a first input signal, the pulsed clocked signal as a second input signal used for clocking the second clocked Flip Flop, and produces a second output signal.

29. The method of claim 28, wherein the first output signal, the second output signal, and the block select signal are utilized by block row enable circuitry to generate an output signal capable of enabling the rows of an associated memory block of the plurality of memory blocks.

30. The method of claim 28, wherein the first output signal, the second output signal, and the block select signal are utilized by block column enable circuitry to generate an output signal capable of enabling the columns of an associated memory block of the plurality of memory blocks.

31. The method of claim 28, wherein the first output signal, the second output signal, the block select signal, and an edge transition detection signal are utilized by block edge transition detection circuitry to generate an output signal capable of detecting the edge transition of an input signal of the memory chip and communicating this detection to an associated memory block of the plurality of memory blocks.

32. The method of claim 28, wherein the first output signal, the second output signal, the block select signal, and a write signal are utilized by block write enable circuitry to generate an output signal capable of enabling write control of an associated memory block of the plurality of memory blocks.

33. A structure for performing long write testing of a memory chip comprising:

a memory chip divided into a plurality of memory blocks, with each memory block of the plurality of memory blocks having a plurality of memory cells, a plurality of rows, a plurality of columns, a plurality of wordlines, a plurality of bitlines true, and a plurality of bitlines complement;

a plurality of block select signals, with each block select signal associated with a memory block;

means, associated with a first memory block of the plurality of memory blocks, for placing the first memory block of the plurality of memory blocks into a long write test mode upon selecting the first memory block, and turning off the plurality of wordlines of the first memory block and forcing at least the bitlines true or the bitlines complement of the first memory block to a low logic level wherein the first memory; block remains in the long write test mode until selected again; and means, associated with a second memory block of the plurality of memory blocks, for placing the second memory block of the plurality of memory blocks into the long write test mode upon selecting the second memory block, and turning off the plurality of wordlines of the second memory block and forcing at least the bitlines true or the bitlines complement of the second memory block to the low logic level, wherein the second memory block remains in the long write test mode until selected again, wherein placing the first memory block into the long write test mode followed by placing the second memory block into the long write test mode constitutes a "domino" style entry into the long write test mode.

34. The structure of claim 33, wherein in placing the first memory block into the long write test mode, also turning on the plurality of columns within the first memory block and in placing the second memory block into the long write test mode, also turning on the plurality of the second memory block.

35. The structure of claim 33, wherein, in placing the first memory block and the second memory block into the long write test mode, the bitlines true of the first memory block and the bitlines true of the second memory block are forced to the low logic level.

36. The structure of claim 33, wherein, in placing the first memory block and the second memory block into the long write test mode, the bitlines true and the bitlines complement of the first memory block and the bitlines true and the bitlines complement of the second memory block are forced to the low logic level.

37. The structure of claim 33, wherein all of the plurality of memory blocks of the memory chip are placed into the long write test mode.

38. The structure of claim 33, wherein the memory chip is a Static Random Access Memory (SRAM).

39. The structure of claim 33, wherein each memory block of the plurality of memory blocks remains in the long write test mode until selected again.

40. The structure of claim 33, wherein a plurality of bitline load elements are connected to the plurality of bitlines true and bitlines complement of the first memory block and the bitline load elements of the first memory block are turned off when the first memory block is placed in the long write test mode, and wherein a plurality of bitline load elements are connected to the plurality of bitlines true and bitlines complement of the second memory block and the bitline load elements of the second memory block are turned off when the second memory block is placed in the long write test mode.

41. The structure of claim 33, wherein after the step of placing the first memory block and the second memory block of the plurality of memory blocks into the long write test mode, comprising the further steps of:

exiting the first memory block of the plurality of memory blocks from the long write test mode by reselecting the first memory block;

placing the first memory block of the plurality of memory blocks into a read disturb test mode upon selecting the first memory block, and allowing the wordlines of the first memory block to be enabled and not forcing the bitlines true or the bitlines complement of the first memory block to the low logic level, wherein the first memory block of the plurality of memory blocks remains in the read disturb test mode while selected;

exiting the second memory block of the plurality of memory blocks from the long write test mode by reselecting the second memory block; and placing the second memory block of the plurality of memory blocks into the read disturb test mode upon selecting the second memory block, and allowing the wordlines of the second memory block to be enabled and not forcing the bitlines true or the bitlines complement of the second memory block to the low logic level, wherein the second memory block of the plurality of memory blocks remains in the read disturb test mode while selected, wherein placing the first memory block into the read disturb test mode followed by placing the second memory block into the read disturb test-mode constitutes a "domino" style entry into the read disturb test mode.

42. The structure of claim 41, wherein after the steps of placing the first memory block and the second memory block of the plurality of memory blocks into the long write test mode and before the step of placing the first memory block of the plurality of memory blocks into the read disturb mode, comprising the additional step of:

performing a pause to cause a long write disturb of the memory chip.

43. The structure of claim 41, wherein all of the plurality of memory blocks of the memory chip are placed into the read disturb test mode.

44. The structure of claim 33, wherein the means for placing each memory block of the plurality of memory blocks into the long write test mode comprises:

a logic element, which has a block select signal as a first input signal and a delay signal as a second input signal and which produces a pulsed clock signal;

a delay element, which has the block select signal as an input signal and which produces the delay signal as an output signal;

a first clocked Flip Flop which receives a long write signal as a first input signal, the pulsed clocked signal as a second input signal used for clocking the first clocked Flip Flop, and produces a first output signal; and a second clocked Flip Flop which receives the first output signal of the first clocked Flip Flop as a first input signal, the pulsed clocked signal as a second input signal used for clocking the second clocked Flip Flop, and produces a second output signal.

45. The structure of claim 44, wherein the first output signal, the second output signal, and the block select signal are utilized by block row enable circuitry to generate an output signal capable of enabling the rows of a memory block of the plurality of memory blocks.

46. The structure of claim 44, wherein the first output signal, the second output signal, and the block select signal are utilized by block column enable circuitry to generate an output signal capable of enabling the columns of a memory block of the plurality of memory blocks.

47. The structure of claim 44, wherein the first output signal, the second output signal, the block select signal, and an edge transition detection signal are utilized by block edge transition detection circuitry to generate an output signal capable of detecting the edge transition of an input signal of the memory chip and communicating this detection to the memory block.

48. The structure of claim 44, wherein the first output signal, the second output signal, the block select signal, and a write signal are utilized by block write enable circuitry to generate an output signal capable of enabling write control of a memory block of the plurality of memory blocks.

* * * * *